US011335640B2

(12) United States Patent
Meyers (10) Patent No.: US 11,335,640 B2
(45) Date of Patent: May 17, 2022

(54) MICROELECTRONIC STRUCTURES HAVING NOTCHED MICROELECTRONIC SUBSTRATES

(71) Applicant: Intel Corporation, Santa Clara, CA (US)

(72) Inventor: John Meyers, Sacramento, CA (US)

(73) Assignee: Intel Corporation, Santa Clara, CA (US)

( * ) Notice: Subject to any disclaimer, the term of this patent is extended or adjusted under 35 U.S.C. 154(b) by 550 days.

(21) Appl. No.: 16/325,056

(22) PCT Filed: Sep. 12, 2016

(86) PCT No.: PCT/US2016/051354
§ 371 (c)(1),
(2) Date: Feb. 12, 2019

(87) PCT Pub. No.: WO2018/048450
PCT Pub. Date: Mar. 15, 2018

(65) Prior Publication Data
US 2021/0287993 A1    Sep. 16, 2021

(51) Int. Cl.
*H01L 23/538*    (2006.01)
*H01L 21/50*    (2006.01)
*H01L 25/065*    (2006.01)
*H01L 23/00*    (2006.01)

(52) U.S. Cl.
CPC .......... *H01L 23/5386* (2013.01); *H01L 21/50* (2013.01); *H01L 24/06* (2013.01); *H01L 25/0657* (2013.01)

(58) Field of Classification Search
CPC .................................................. H01L 23/5386
See application file for complete search history.

(56) References Cited

U.S. PATENT DOCUMENTS

| | | | |
|---|---|---|---|
| 2003/0045083 A1 | 3/2003 | Towle et al. | |
| 2009/0321950 A1 | 12/2009 | Takiar et al. | |
| 2011/0309525 A1 | 12/2011 | Nasu et al. | |
| 2013/0249116 A1 | 9/2013 | Mohammed et al. | |
| 2015/0179626 A1 | 6/2015 | Zhang et al. | |
| 2015/0221617 A1* | 8/2015 | Haba ................. | H01L 23/49838 257/778 |
| 2015/0359100 A1 | 12/2015 | Zhao et al. | |

OTHER PUBLICATIONS

International Preliminary Report on Patentability for PCT Application No. PCT/US16/51354, dated Mar. 21, 2019.
International Search Report and Written Opinion for International Patent Application No. PCT/US16/51354, dated Jun. 12, 2017.

* cited by examiner

*Primary Examiner* — William A Harriston
(74) *Attorney, Agent, or Firm* — Essential Patents Group, LLP.

(57) ABSTRACT

A microelectronic package may be fabricated having at least one microelectronic die attached to a microelectronic substrate, wherein the microelectronic substrate includes at least one notch formed in at least one side thereof. The microelectronic dice may be attached to a first surface of the microelectronic substrate and in electronic communication with a bond pad on a second surface of the microelectronic substrate with a bond wire which extends through the notch in the microelectronic substrate.

14 Claims, 7 Drawing Sheets

MICROELECTRONIC STRUCTURES HAVING NOTCHED MICROELECTRONIC SUBSTRATES

CLAIM OF PRIORITY

This Application is a National Stage Entry of, and claims priority to, PCT Application No. PCT/US16/51354, filed on 12 Sep. 2016 and titled "MICROELECTRONIC STRUCTURES HAVING NOTCHED MICROELECTRONIC SUBSTRATES", which is incorporated by reference in its entirety for all purposes.

TECHNICAL FIELD

Embodiments of the present description generally relate to the field of microelectronic structures, and, more particularly, to a microelectronic structure having a microelectronic substrate modified to allow for thin microelectronic structure configurations.

BACKGROUND

The microelectronic industry is continually striving to produce ever faster, smaller, and thinner microelectronic structures for use in various electronic products, including, but not limited to, computer server products and portable products, such as wearable microelectronic systems, portable computers, electronic tablets, cellular phones, digital cameras, and the like.

One way to achieve these goals is by increasing integration density, such as by stacking components of the microelectronic structure. However, stacking components may result in the microelectronic structure having an unacceptable thickness.

Therefore, there is a need to develop novel microelectronic die stacking configurations and component designs to maintain an acceptable thickness of a microelectronic structure.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description may include a microelectronic structure having at least one microelectronic die attached to a microelectronic substrate, wherein the microelectronic substrate includes at least one notch formed in at least one side thereof. The microelectronic dice may be attached to a first surface of the microelectronic substrate and in electronic communication with a bond pad on a second surface of the microelectronic substrate with a bond wire which extends through the notch in the microelectronic substrate.

Figure 1:
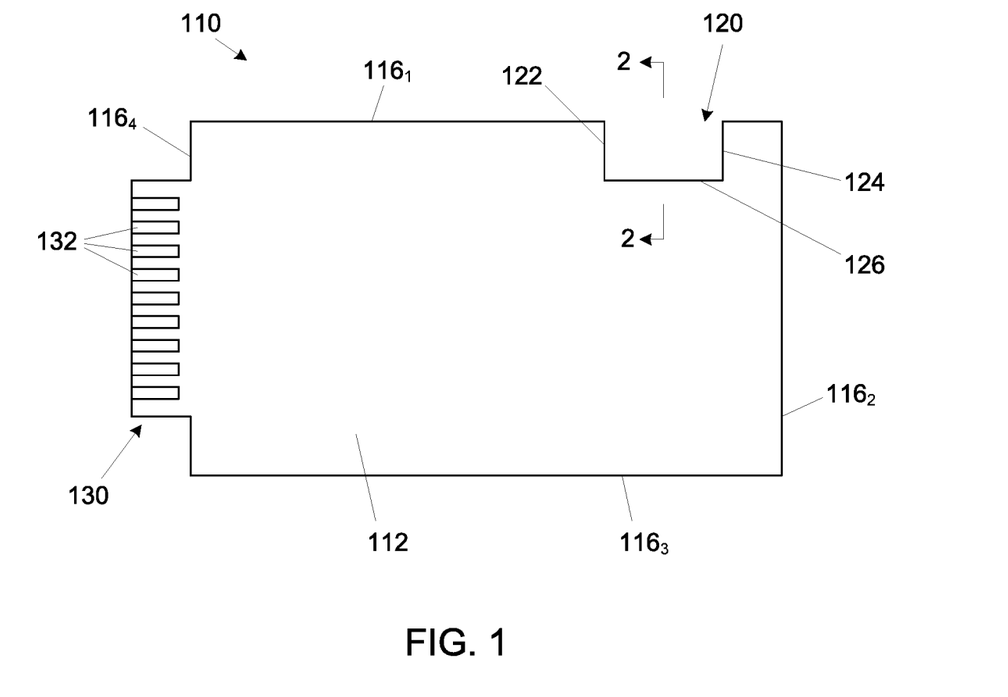
FIG. 1 illustrates a top plan view of a microelectronic substrate having at least one notch defined therethrough, according to an embodiment of the present description.
Figure 2:
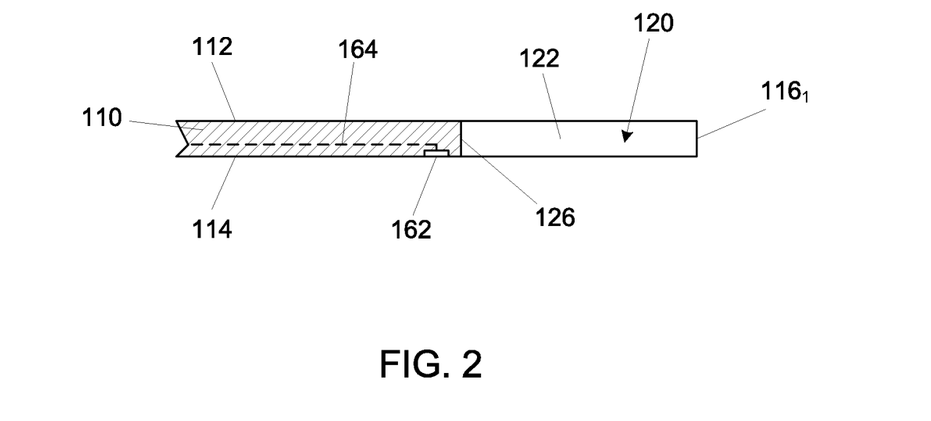
FIG. 2 illustrates a side cross-sectional view of the microelectronic substrate along line 2-2 of FIG. 1, according to one embodiment of the present description.

FIGS. 1 and 2 illustrate a top view and a cross-sectional view, respectively, of a microelectronic substrate 110 having a first surface 112, an opposing second surface 114 (see FIG. 2), and a plurality of sides, illustrated as a first side $116_1$, a second side $116_2$, a third side $116_3$, and a fourth side $116_4$, extending from the microelectronic substrate first surface 112 and the microelectronic substrate second surface 114 (see FIG. 2). The microelectronic substrate 110 may have at least one notch 120 or "cut-out" formed therethrough. The microelectronic substrate notch 120 may be defined by a notch first side 122 and a notch second side 124, each extending from the microelectronic substrate first side $116_1$ into the microelectronic substrate 110, and a notch third side 126 extending between the notch first side 122 and the notch second side 124. In one embodiment, the notch first side 122 and the notch second side 124 each extend substantially perpendicular to the microelectronic substrate first side $116_1$. In a further embodiment, the notch third side 126 may extend substantially perpendicular to the notch first side 122 and the notch second side 124. The microelectronic substrate notch 120 may be formed by removing material by any means known in the art.

The microelectronic substrate 110 may comprise any appropriate dielectric material, including, but not limited to, liquid crystal polymer, epoxy resin, bismaleimide triazine resin, FR4, polyimide materials, and the like, and may include conductive routes 164 (see FIG. 2) formed therein and/or thereon to form any desired electrical route with the microelectronic substrate 110. The processes used for forming the microelectronic substrate 110 are well known to those skilled in the art, and for the sake of brevity and conciseness will not be described or illustrated herein.

As shown in FIG. 1, the microelectronic substrate 110 may include an edge connector 130 extending from one side of the microelectronic substrate 110 (shown extending from the microelectronic substrate fourth side $116_4$). The edge connector 130 may include a plurality of conductive fingers 132, which may be in electrical contact with the microelectronic substrate conductive traces 164 (see FIG. 2). As will be understood to those skilled in the art, the edge connector 130 is intended to plug into a matching socket (not shown) to electrically connect the microelectronic substrate 110 with an external component (not shown).

Figure 3:
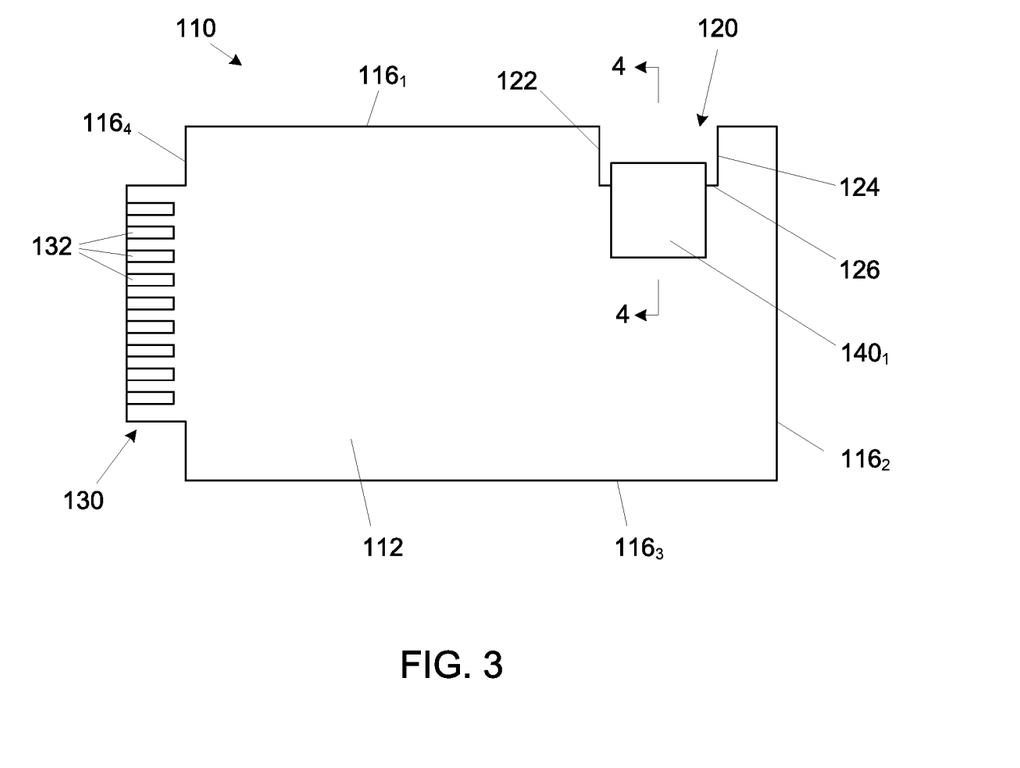
FIG. 3 illustrates a top plan view of the microelectronic substrate of FIG. 1 having a first microelectronic die attached thereto, according to an embodiment of the present description.
Figure 4:
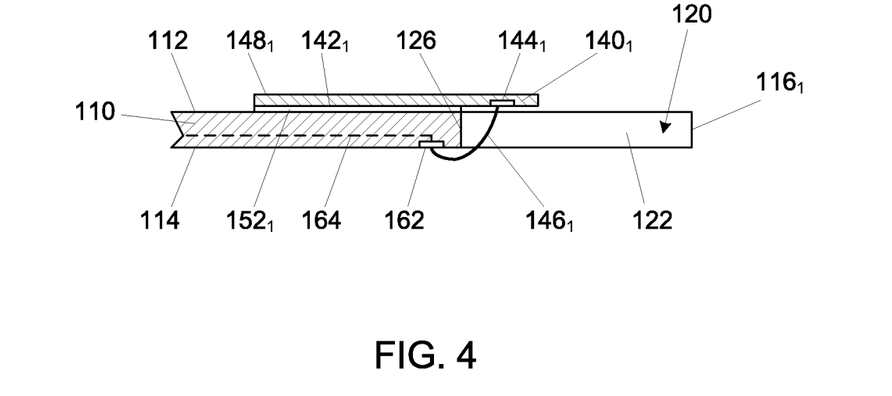
FIG. 4 illustrates a side cross-sectional view of the microelectronic substrate and the first microelectronic die along line 4-4 of FIG. 3, according to one embodiment of the present description.

As shown in FIGS. 3 and 4, a first microelectronic die $140_1$ may be attached to the microelectronic substrate 110 with a first die attach adhesive layer $152_1$ (see FIG. 4) disposed between a first surface $142_1$ (see FIG. 4) of the first microelectronic die $140_1$ and the microelectronic substrate first surface 112. The first microelectronic die $140_1$ may include at least one bond pad $144_1$ formed in or on the first microelectronic die active surface $142_1$. As illustrated, the first microelectronic die $140_1$ may be attached such that a portion of the first microelectronic die $140_1$ extends over the microelectronic substrate notch 120 to expose the at least one first microelectronic die bond pad $144_1$ through the microelectronic substrate notch 120. As shown in FIG. 4, the microelectronic substrate 110 may include at least one bond pad 162 formed in or one the microelectronic structure second surface 114. The first microelectronic die bond pads $144_1$ may be electrically connected to corresponding microelectronic substrate bond pads 162 with at least one first bond wire $146_1$ extending through the notch 120. The microelectronic substrate bond pads 162 may be electrically connected to the conductive routes 164 on or within the microelectronic substrate 110. It is understood that the at least one first microelectronic die bond pad $144_1$ may be in electrical communication with integrated circuitry (not shown) within the first microelectronic die $140_1$.

Figure 5:
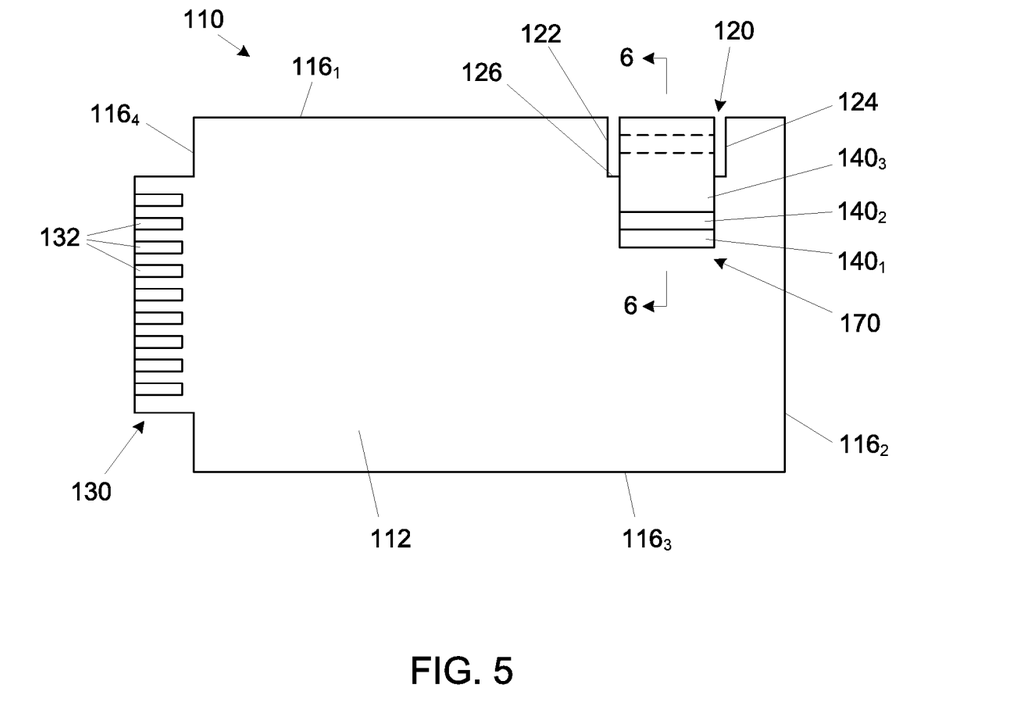
FIG. 5 illustrates a top plan view of the microelectronic substrate of FIG. 1 having a microelectronic die stack attached thereto, according to an embodiment of the present description.
Figure 6:
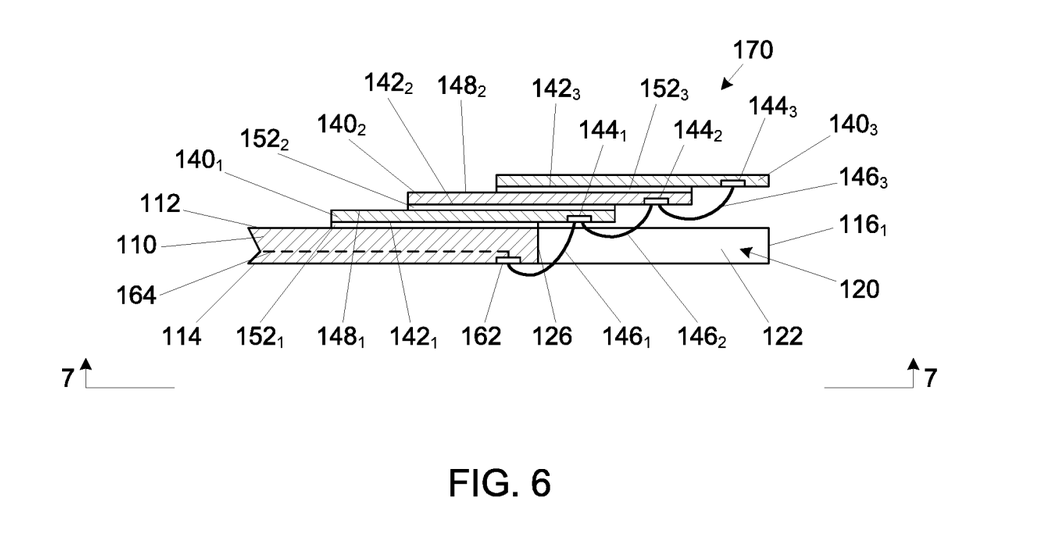
FIG. 6 illustrates a side cross-sectional view of the microelectronic substrate and the microelectronic die stack along line 6-6 of FIG. 5, according to one embodiment of the present description.
Figure 7:
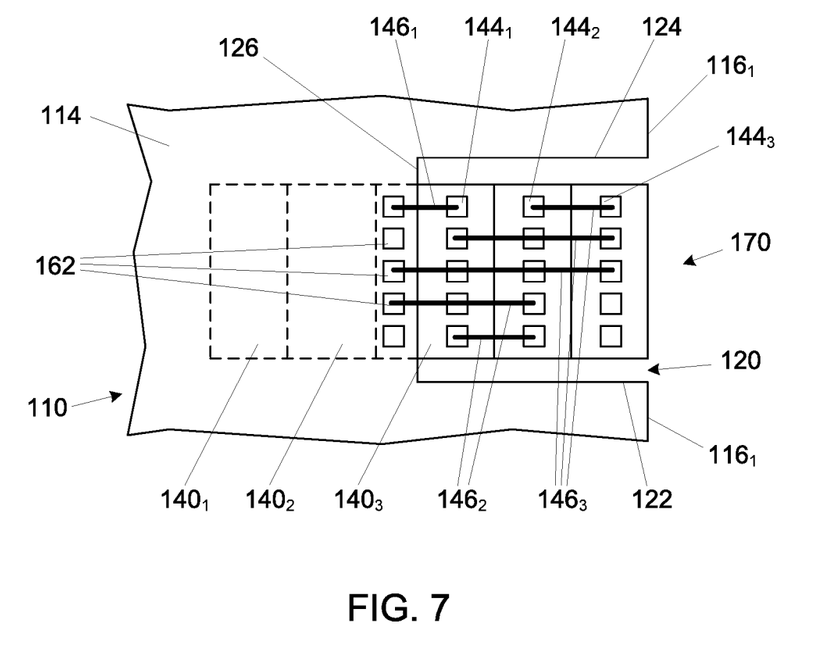
FIG. 7 illustrates a bottom plan view of the microelectronic substrate and the microelectronic die stack along line 7-7 of FIG. 6, according to an embodiment of the present description.

As shown in FIGS. 5, 6, and 7, at least one additional microelectronic die (illustrated as a second microelectronic die $140_2$ and a third microelectronic die $140_3$) may be stacked on the first microelectronic die $140_1$ to form a microelectronic die stack 170. As shown in FIG. 6, the second microelectronic die $140_2$ may be attached to the first microelectronic die $140_1$ with a second die attach adhesive layer $152_2$ disposed between a first surface $142_2$ of the second microelectronic die $140_2$ and a back surface $148_1$ of the first microelectronic die $140_1$. The second microelectronic die $140_2$ may have at least one bond pad $144_2$ formed in or on the second microelectronic die first surface $142_2$, wherein the second microelectronic die $140_2$ may be aligned such that a portion of the second microelectronic die $140_2$ extends over the microelectronic substrate notch 120 to expose the at least one second microelectronic die bond pad $144_2$ through the microelectronic substrate notch 120. The second microelectronic die bond pads $144_2$ may be electrically connected to corresponding microelectronic substrate bond pads 162 with at least one additional bond wire, such as a second bond wire $146_2$, extending through the microelectronic substrate notch 120 and/or with a corresponding first microelectronic die bond pad $144_1$ with at least one second bond wire $146_2$ (see FIG. 7).

As further shown in FIG. 6, the third microelectronic die $140_3$ may be attached to the second microelectronic die $140_2$ with a third die attach adhesive layer $152_3$ disposed between a first surface $142_3$ of the third microelectronic die $140_3$ and the second microelectronic die second surface $148_2$. The third microelectronic die first surface $142_3$ may have at least one bond pad $144_3$ formed in or on the third microelectronic die first surface $142_3$, wherein the third microelectronic die $140_3$ may be aligned such that a portion of the third microelectronic die $140_3$ extends over the microelectronic substrate notch 120 to expose the at least one third microelectronic die bond pad $144_3$ through the microelectronic substrate notch 120. The third microelectronic die bond pads $144_3$ may be electrically connected to corresponding microelectronic substrate bond pads 162 with at least one additional bond wire, such as a third bond wire $146_3$ extending through the microelectronic substrate notch 120, with a corresponding first microelectronic die bond pad $144_1$ with at least one third bond wire $146_3$, and/or with corresponding second microelectronic die bond pads $144_2$ with at least one third bond wire $146_3$ (see FIG. 7). It is understood that the second microelectronic die bond pads $144_2$ and the third microelectronic die bond pads $144_3$ may be in electrical communication with integrated circuitry (not shown) within the second microelectronic die $140_2$ and the third microelectronic die $140_3$, respectively.

The first microelectronic die $140_1$, the second microelectronic die $140_2$, and/or the third microelectronic die $140_3$, may be any appropriate microelectronic device, including, but not limited to, microprocessors, chipsets, graphics devices, wireless devices, memory devices, application specific integrated circuit devices, and the like. In a specific embodiment, the first microelectronic die $140_1$, the second microelectronic die $140_2$, and/or the third microelectronic die $140_3$, may be memory devices.

Figure 8:
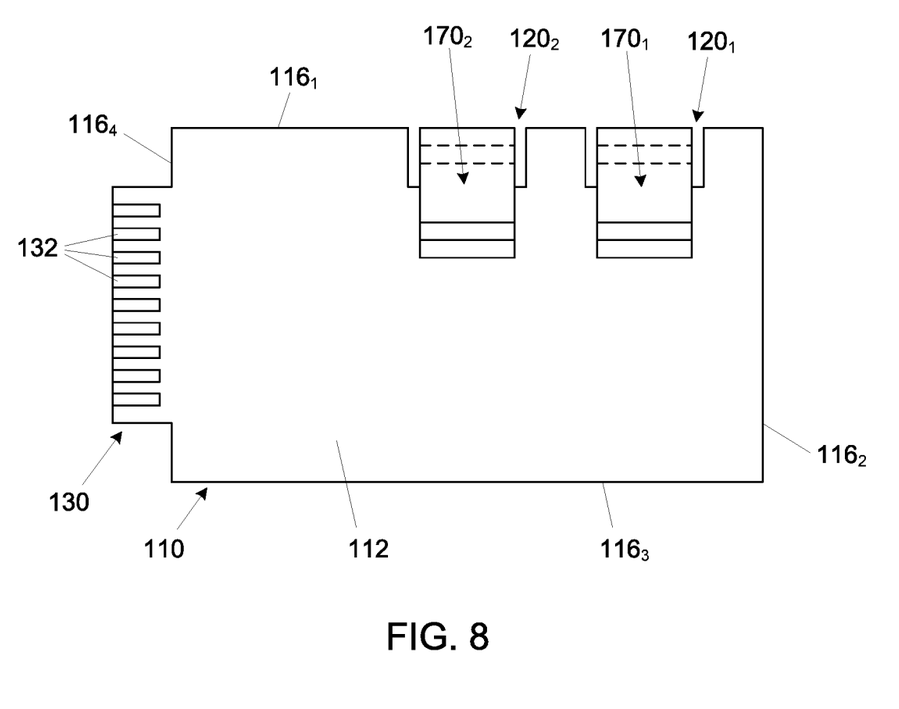
FIG. 8 illustrates a top plan view of the microelectronic substrate having a plurality of notches and a plurality of microelectronic die stacks attached thereto, according to another embodiment of the present description.

It is, of course, understood that embodiments of the present description are not limited to in the number of microelectronic dice in the microelectronic die stack 170, as any appropriate number came be stacked. As shown in FIG. 8, embodiments of the present description are not limited to the number of notches and formed in microelectronic substrate 110 or microelectronic die stacks attached to the microelectronic substrate 110, as any appropriate number of notches (illustrated as a first notch $120_1$ and a second notch $120_2$) may be formed with corresponding microelectronic die stacks (illustrated as a first microelectronic die stack $170_1$ and a second microelectronic die stack $170_2$). Moreover, embodiments of the present description are not limited to the notches being formed only in a single side of the microelectronic substrate 110. The notches, such as illustrated notches 120, $120_1$, and $120_2$, may be on any side of the microelectronic substrate 110, such as illustrate sides $116_1$, $116_2$, $116_3$, and $116_4$, and may be on multiple sides of the microelectronic substrate 110.

Figure 9:
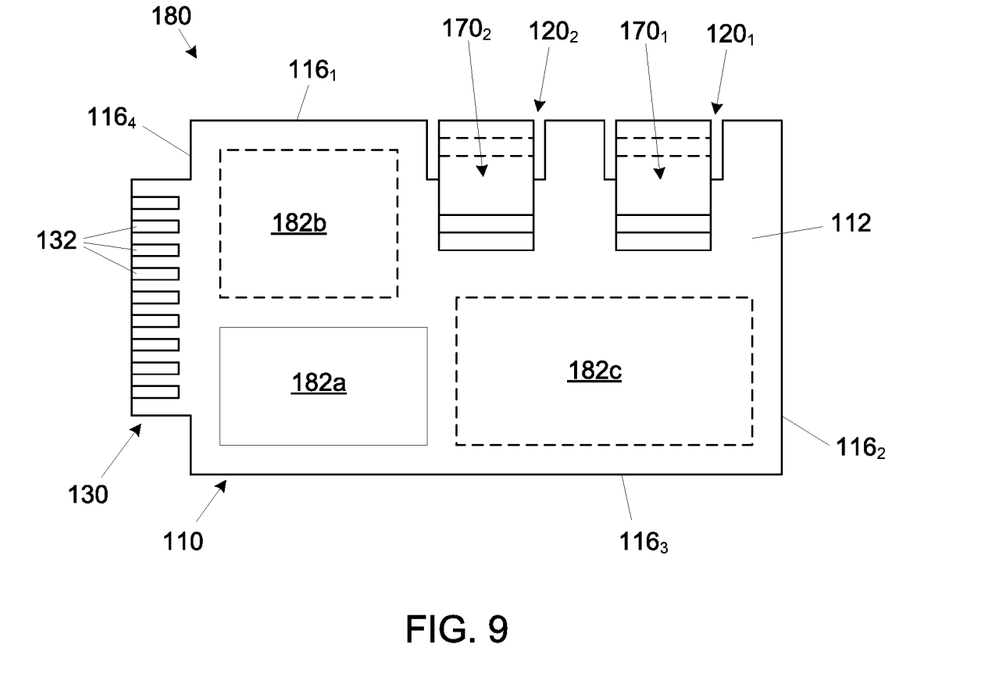
FIG. 9 illustrates a top plan view of the microelectronic structure, according to an embodiment of the present description.

FIG. 9 illustrates a microelectronic structure 180, wherein the microelectronic structure 180 may include at least one operational microelectronic die electrically attached to the microelectronic substrate 110 (shown as a first operational microelectronic die 182a electrically attached to the microelectronic substrate first surface 112, and a second operational die 182b and a third operational die 182c (shown in dashed lines) electrically attached to the microelectronic substrate second surface 114 (see FIG. 7)). The operational microelectronic dice 182a, 182b, and 182c may be any appropriate microelectronic devices, including, but not limited to, microprocessors, chipsets, graphics devices, wireless devices, memory devices, application specific integrated circuit devices, and the like. In a specific embodiment, the first microelectronic die stack $170_1$ and the second microelectronic die stack $170_2$ are stacks of memory devices and at least one of the operational microelectronic dice 182a, 182b, and 182c is an application specific integrated circuit device.

Figure 10:
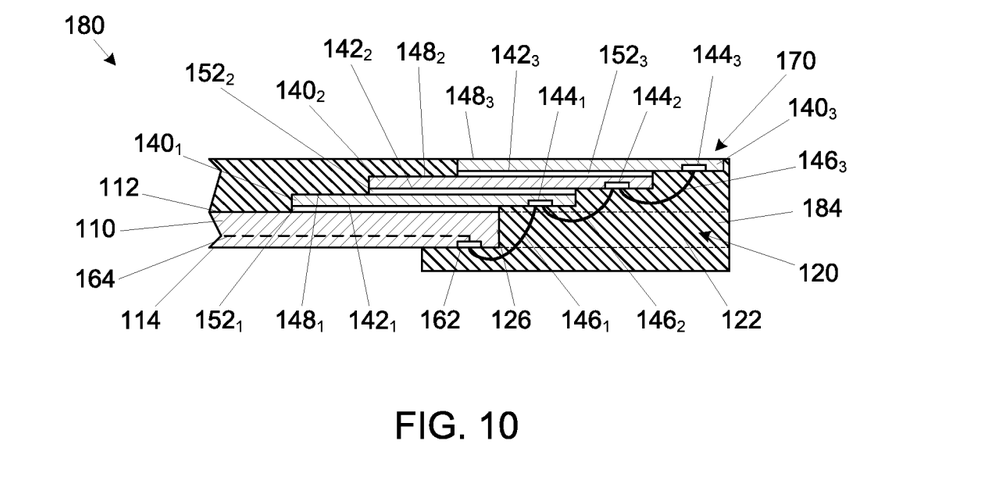
FIG. 10 illustrates a side cross-sectional view of the microelectronic substrate and the microelectronic die stack with an encapsulation material disposed thereon, according to one embodiment of the present description.

FIG. 10 illustrates that the microelectronic structure 180 may include an encapsulant material 184 to encapsulate and protect the bond wires, such first bond wires 146i, second bond wires $146_2$, and third bond wires $146_3$. In one embodiment, the encapsulant material 184 fills the microelectronic substrate notch 120. In another embodiment, the encapsulant material 184 encapsulates the microelectronic die stack 170. In yet another embodiment, the encapsulant material 184 may not completely encapsulate the microelectronic die stack 170 to minimize the thickness of the microelectronic structure 180. In further embodiments, the encapsulant material 184 may contact the microelectronic substrate first surface 112, the microelectronic substrate second surface 114, or both. The encapsulant material 184 may be any appropriate material, including, but not limited to, polymer materials with or with appropriate fillers.

Figure 11:
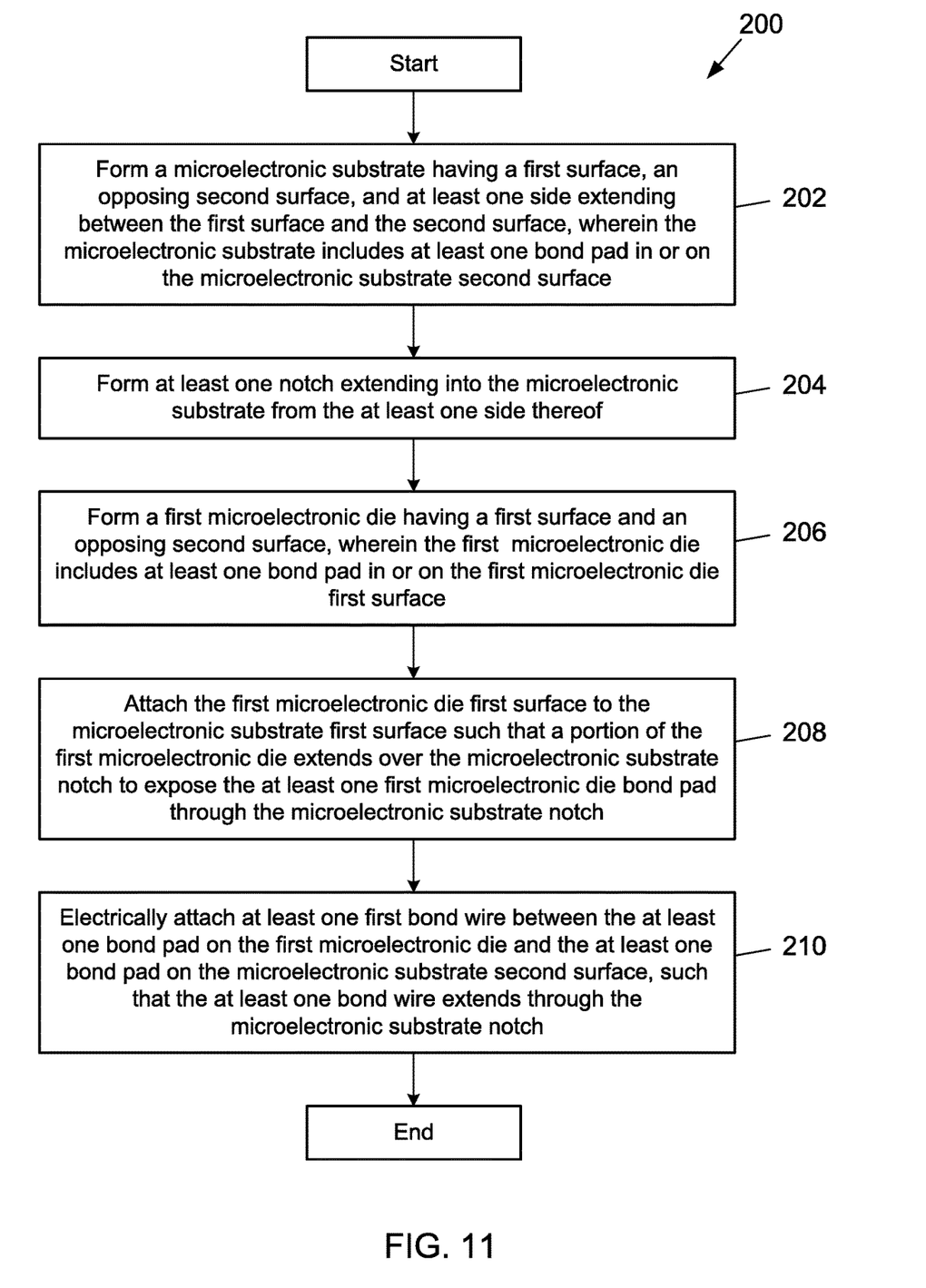
FIG. 11 is a flow diagram of a process of fabricating a microelectronic structure, according to an embodiment of the present description.

FIG. 11 is a flow chart of a process 200 of fabricating a microelectronic package according to an embodiment of the present description. As set forth in block 202, a microelectronic substrate having a first surface, an opposing second surface, and at least one side extending between the first surface and the second surface may be formed, wherein the microelectronic structure includes at least one bond pad in or on the first microelectronic substrate second surface. At least one notch extending into the microelectronic substrate from the at least one side thereof may be formed, as set forth in block 204. As set forth in block 206, a first microelectronic die having a first surface and an opposing second surface may be formed, wherein the first microelectronic die includes at least one bond pad in or on the first microelectronic die first surface. The first microelectronic die first surface may be attached to the microelectronic substrate first surface such that a portion of the first microelectronic die extends over the microelectronic substrate notch to expose the at least one first microelectronic die bond pad through the microelectronic substrate notch, as set forth in block 208. As set forth in block 210, at least one first bond wire may be electrically attached between the at least one bond pad on the first microelectronic die and the at least one bond pad on the microelectronic surface second surface, such that the at least one bond wire extends through the microelectronic substrate notch.

Figure 12:
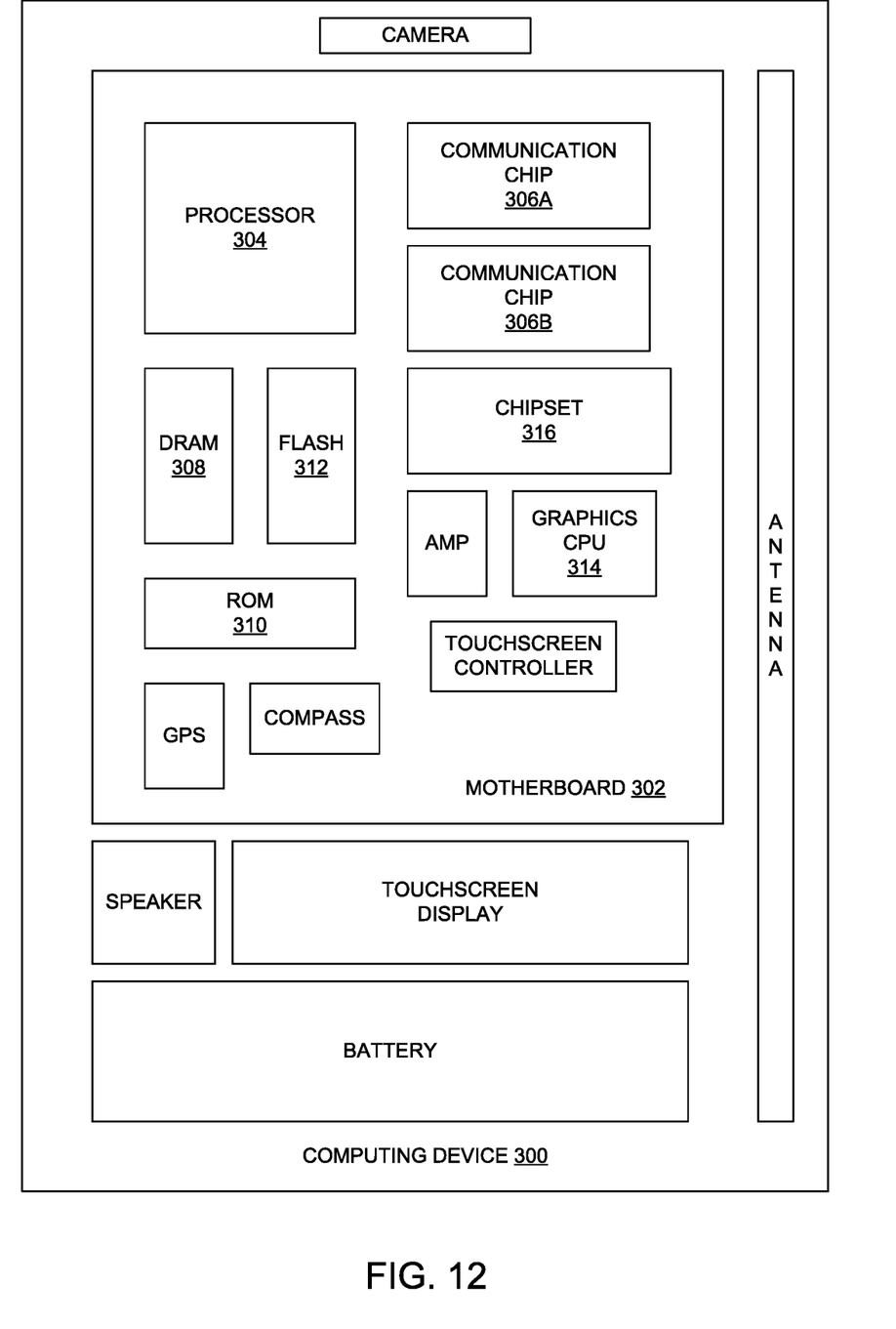
FIG. 12 illustrates a computing device in accordance with one implementation of the present description.

FIG. 12 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 400 may include a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface; a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch; and at least one first bond wire extending through the microelectronic substrate notch and electrically attached to the at least one bond pad on the first microelectronic die and to the at least one bond pad on the microelectronic substrate second surface.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other microelectronic devices and assembly applications, as well as any appropriate electronic application, as will be understood to those skilled in the art.

The follow examples pertain to further embodiments and specifics in the examples may be used anywhere in one or more embodiments, wherein Example 1 is a microelectronic structure, comprising: a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface; a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch; and at least one first bond wire extending through the microelectronic substrate notch and electrically attached to the at least one bond pad on the first microelectronic die and to the at least one bond pad on the microelectronic substrate second surface.

In Example 2, the subject matter of Example 1 can optionally include the first microelectronic die comprising a memory device.

In Example 3, the subject matter of Example 1 can optionally include at least one operational microelectronic device attached to the microelectronic substrate.

In Example 4, the subject matter of Example 3 can optionally include the at least one operational microelectronic device being in electrical communication with the first microelectronic die.

In Example 5, the subject matter of Example 1 can optionally include an encapsulation material disposed within the microelectronic substrate notch.

In Example 6, the subject matter of Example 1 can optionally include at least one additional microelectronic die having a first surface with at least one bond pad in or on the first surface, and wherein the at least one additional microelectronic die first surface is attached to the first microelectronic die second surface such that a portion of the at least one additional microelectronic die extends over the microelectronic substrate notch to expose the at least one additional microelectronic die bond pad through the microelectronic substrate notch; and wherein the at least one additional microelectronic die pond pad is electrically connected to corresponding microelectronic substrate bond pad with at least one additional bond wire extending through the microelectronic notch and/or with a corresponding first microelectronic die bond pad with at least one additional bond wire.

In Example 7, the subject matter of Example 6 can optionally include at least one of the first microelectronic die and the at least one additional microelectronic die comprising a memory device.

In Example 8, the subject matter of Example 1 can optionally include at least one operational microelectronic device attached to the microelectronic substrate.

In Example 9, the subject matter of Example 8 can optionally include the at least one operation microelectronic device being in electrical communication with at least one the first microelectronic die and the at least one additional microelectronic die.

In Example 10, the subject matter of Example 1 can optionally include an encapsulation material disposed within the microelectronic substrate notch.

In Example 11, the subject matter of Example 1 can optionally include a second microelectronic die having a first surface and an opposing second surface, wherein the second microelectronic die first surface is attached to the first microelectronic die, wherein the at least one additional microelectronic die includes at least one bond pad in or on its first surface, and wherein the second microelectronic die first surface is attached to the first microelectronic die second surface such that a portion of the second microelectronic die extends over the microelectronic substrate notch to expose the at least one second microelectronic die bond pad through the microelectronic substrate notch; a third microelectronic die having a first surface with at least one bond pad in or on its first surface, wherein the third microelectronic die first surface is attached to the second microelectronic die second surface, and wherein the third microelectronic die first surface is attached to the second microelectronic die second surface such that a portion of the third microelectronic die extends over the microelectronic substrate notch to expose the at least one third microelectronic die bond pad through the microelectronic substrate notch; at least one second bond wire attached to the at least one second microelectronic die bond pad and attached to at least one of the microelectronic substrate bond pads and/or to at least one first microelectronic die bond pad; and at least one third bond wire attached to the at least one third microelectronic die bond pad and attached to at least one of the microelectronic substrate bond pads, to at least one first microelectronic die bond pad, and/or to at least one second microelectronic die bond pad.

In Example 12, a method of fabricating a microelectronic package may comprise forming a microelectronic substrate having a first surface, an opposing second surface, and at least one side extending between the first surface and the second surface, wherein the microelectronic substrate includes at least one bond pad in or on the microelectronic substrate second surface; forming at least one notch extending into the microelectronic substrate from the at least one side thereof; forming a first microelectronic device having a first surface and an opposing second surface, wherein the first microelectronic device includes at least one bond pad in or on the first microelectronic device first surface; attaching the first microelectronic device first surface to the microelectronic substrate first surface such that a portion of the first microelectronic device extends over the microelectronic substrate notch to expose the at least one first microelectronic device bond pad through the microelectronic substrate notch; and electrically attaching at least one first bond wire between the at least one bond pad on the first microelectronic device and the at least one bond pad on the microelectronic substrate second surface, such that the at least one first bond wire extends through the microelectronic substrate notch.

In Example 13, the subject matter of Example 12 can optionally include forming the first microelectronic die comprising forming a first memory device.

In Example 14, the subject matter of Example 12 can optionally include attaching at least one operational microelectronic device to the microelectronic substrate.

In Example 15, the subject matter of Example 14 can optionally include attaching the at least one operation microelectronic device to the microelectronic substrate including forming electrical communication with the first microelectronic die.

In Example 16, the subject matter of Example 12 can optionally include disposing an encapsulation material within the microelectronic substrate notch.

In Example 17, the subject matter of Example 12 can optionally include forming at least one additional microelectronic die having a first surface with at least one bond pad in or on the first surface; attaching the at least one additional microelectronic die first surface to the first microelectronic die second surface such that a portion of the at least one additional microelectronic die extends over the microelectronic substrate notch to expose the at least one additional microelectronic die bond pad through the microelectronic substrate notch; and electrically connecting the at least one additional microelectronic die pond pad to corresponding microelectronic substrate bond pad with at least one additional bond wire extending through the microelectronic notch and/or with a corresponding first microelectronic die bond pad with at least one additional bond wire.

In Example 18, the subject matter of Example 17 can optionally include forming at least one of the first microelectronic die and forming the at least one additional microelectronic die comprising forming a first memory device and forming at least one additional memory device.

In Example 19, the subject matter of Example 17 can optionally include attaching at least one operational microelectronic device to the microelectronic substrate.

In Example 20, the subject matter of Example 19 can optionally include attaching the at least one operational microelectronic device comprising forming electrical communication between the at least one operational microelectronic device and at least one the first microelectronic die and/or the at least one additional microelectronic die.

In Example 21, the subject matter of Example 12 can optionally include disposing an encapsulation material within the microelectronic substrate notch.

In Example 22, the subject matter of Example 12 can optionally include forming a second microelectronic die having a first surface and an opposing second surface, wherein the at least one additional microelectronic die includes at least one bond pad in or on its first surface; attaching the second microelectronic die first surface to the first microelectronic die second surface such that a portion of the second microelectronic die extends over the microelectronic substrate notch to expose the at least one second microelectronic die bond pad through the microelectronic substrate notch; forming a third microelectronic die having a first surface with at least one bond pad in or on its first surface; attaching the third microelectronic die first surface to the second microelectronic die second surface such that a portion of the third microelectronic die extends over the microelectronic substrate notch to expose the at least one third microelectronic die bond pad through the microelectronic substrate notch; attaching at least one second bond wire to the at least one second microelectronic die bond pad and to at least one of the microelectronic substrate bond pads and/or to at least one first microelectronic die bond pad; and attaching at least one third bond wire to the at least one third microelectronic die bond pad and to at least one of the microelectronic substrate bond pads, to at least one first microelectronic die bond pad, and/or to at least one second microelectronic die bond pad.

In Example 23, an electronic system may comprise a board; and a microelectronic structure attached to the board, wherein the microelectronic structure includes a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface; a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch; and at least one first bond wire extending through the microelectronic substrate notch and electrically attached to the at least one bond pad on the first microelectronic die and to the at least one bond pad on the microelectronic substrate second surface.

In Example 24, the subject matter of Example 23 can optionally include the first microelectronic die comprising a memory device.

In Example 25, the subject matter of Example 23 can optionally include at least one operational microelectronic device attached to the microelectronic substrate.

In Example 26, the subject matter of Example 25 can optionally include the at least one operational microelectronic device being in electrical communication with the first microelectronic die.

In Example 27, the subject matter of Example 23 can optionally include an encapsulation material disposed within the microelectronic substrate notch.

In Example 28, the subject matter of Example 23 can optionally include at least one additional microelectronic die having a first surface with at least one bond pad in or on the first surface, and wherein the at least one additional microelectronic die first surface is attached to the first microelectronic die second surface such that a portion of the at least one additional microelectronic die extends over the microelectronic substrate notch to expose the at least one additional microelectronic die bond pad through the microelectronic substrate notch; and wherein the at least one additional microelectronic die pond pad is electrically connected to corresponding microelectronic substrate bond pad with at least one additional bond wire extending through the microelectronic notch and/or with a corresponding first microelectronic die bond pad with at least one additional bond wire.

In Example 29, the subject matter of Example 28 can optionally include at least one of the first microelectronic die and the at least one additional microelectronic die comprising a memory device.

In Example 30, the subject matter of Example 23 can optionally include at least one operational microelectronic device attached to the microelectronic substrate.

In Example 31, the subject matter of Example 30 can optionally include the at least one operation microelectronic device being in electrical communication with at least one the first microelectronic die and the at least one additional microelectronic die.

In Example 32, the subject matter of Example 23 can optionally include an encapsulation material disposed within the microelectronic substrate notch.

In Example 33, the subject matter of Example 23 can optionally include a second microelectronic die having a first surface and an opposing second surface, wherein the second microelectronic die first surface is attached to the first microelectronic die, wherein the at least one additional microelectronic die includes at least one bond pad in or on its first surface, and wherein the second microelectronic die first surface is attached to the first microelectronic die second surface such that a portion of the second microelectronic die extends over the microelectronic substrate notch to expose the at least one second microelectronic die bond pad through the microelectronic substrate notch; a third microelectronic die having a first surface with at least one bond pad in or on its first surface, wherein the third microelectronic die first surface is attached to the second microelectronic die second surface, and wherein the third microelectronic die first surface is attached to the second microelectronic die second surface such that a portion of the third microelectronic die extends over the microelectronic substrate notch to expose the at least one third microelectronic die bond pad through the microelectronic substrate notch; at least one second bond wire attached to the at least one second microelectronic die bond pad and attached to at least one of the microelectronic substrate bond pads and/or to at least one first microelectronic die bond pad; and at least one third bond wire attached to the at least one third microelectronic die bond pad and attached to at least one of the microelectronic substrate bond pads, to at least one first microelectronic die bond pad, and/or to at least one second microelectronic die bond pad.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
    a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface;
    a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch;
    at least one first bond wire extending through the microelectronic substrate notch and electrically attached to the at least one bond pad on the first microelectronic die and to the at least one bond pad on the microelectronic substrate second surface;
    at least one additional microelectronic die having a first surface with at least one bond pad in or on the first surface, and wherein the at least one additional microelectronic die first surface is attached to the first microelectronic die second surface such that a portion of the at least one additional microelectronic die extends over the microelectronic substrate notch to expose the at least one additional microelectronic die bond pad through the microelectronic substrate notch; and
    wherein the at least one additional microelectronic die pond pad is electrically connected to corresponding microelectronic substrate bond pad with at least one additional bond wire extending through the microelectronic notch and/or with a corresponding first microelectronic die bond pad with at least one additional bond wire.

2. The microelectronic structure of claim 1, wherein at least one of the first microelectronic die and the at least one additional microelectronic die comprises a memory device.

3. The microelectronic structure of claim 1, further comprising at least one operational microelectronic device attached to the microelectronic substrate.

4. The microelectronic structure of claim 3, wherein the at least one operation microelectronic device is in electrical communication with at least one the first microelectronic die and the at least one additional microelectronic die.

5. A microelectronic structure comprising:
    a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface;

a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch;

at least one first bond wire extending through the microelectronic substrate notch and electrically attached to the at least one bond pad on the first microelectronic die and to the at least one bond pad on the microelectronic substrate second surface;

a second microelectronic die having a first surface and an opposing second surface, wherein the second microelectronic die first surface is attached to the first microelectronic die, wherein the at least one additional microelectronic die includes at least one bond pad in or on its first surface, and wherein the second microelectronic die first surface is attached to the first microelectronic die second surface such that a portion of the second microelectronic die extends over the microelectronic substrate notch to expose the at least one second microelectronic die bond pad through the microelectronic substrate notch;

a third microelectronic die having a first surface with at least one bond pad in or on its first surface, wherein the third microelectronic die first surface is attached to the second microelectronic die second surface, and wherein the third microelectronic die first surface is attached to the second microelectronic die second surface such that a portion of the third microelectronic die extends over the microelectronic substrate notch to expose the at least one third microelectronic die bond pad through the microelectronic substrate notch;

at least one second bond wire attached to the at least one second microelectronic die bond pad and attached to at least one of the microelectronic substrate bond pads and/or to at least one first microelectronic die bond pad; and at least one third bond wire attached to the at least one third microelectronic die bond pad and attached to at least one of the microelectronic substrate bond pads, to at least one first microelectronic die bond pad, and/or to at least one second microelectronic die bond pad.

6. A method of fabricating a microelectronic package, comprising:

forming a microelectronic substrate having a first surface, an opposing second surface, and at least one side extending between the first surface and the second surface, wherein the microelectronic substrate includes at least one bond pad in or on the microelectronic substrate second surface;

forming at least one notch extending into the microelectronic substrate from the at least one side thereof;

forming a first microelectronic device having a first surface and an opposing second surface, wherein the first microelectronic device includes at least one bond pad in or on the first microelectronic device first surface;

attaching the first microelectronic device first surface to the microelectronic substrate first surface such that a portion of the first microelectronic device extends over the microelectronic substrate notch to expose the at least one first microelectronic device bond pad through the microelectronic substrate notch;

electrically attaching at least one first bond wire between the at least one bond pad on the first microelectronic device and the at least one bond pad on the microelectronic substrate second surface, such that the at least one first bond wire extends through the microelectronic substrate notch;

forming at least one additional microelectronic die having a first surface with at least one bond pad in or on the first surface;

attaching the at least one additional microelectronic die first surface to the first microelectronic die second surface such that a portion of the at least one additional microelectronic die extends over the microelectronic substrate notch to expose the at least one additional microelectronic die bond pad through the microelectronic substrate notch; and electrically connecting the at least one additional microelectronic die pond pad to corresponding microelectronic substrate bond pad with at least one additional bond wire extending through the microelectronic notch and/or with a corresponding first microelectronic die bond pad with at least one additional bond wire.

7. The method of claim 6, wherein at least one of forming the first microelectronic die and forming the at least one additional microelectronic die comprises forming a memory device.

8. The method of claim 6, further comprising attaching at least one operational microelectronic device to the microelectronic substrate.

9. The method of claim 8, wherein attaching the at least one operational microelectronic device comprises forming electrical communication between the at least one operational microelectronic device and at least one the first microelectronic die and/or the at least one additional microelectronic die.

10. A method of fabrication a microelectronic package, comprising:

forming a microelectronic substrate having a first surface, an opposing second surface, and at least one side extending between the first surface and the second surface, wherein the microelectronic substrate includes at least one bond pad in or on the microelectronic substrate second surface;

forming at least one notch extending into the microelectronic substrate from the at least one side thereof;

forming a first microelectronic device having a first surface and an opposing second surface, wherein the first microelectronic device includes at least one bond pad in or on the first microelectronic device first surface;

attaching the first microelectronic device first surface to the microelectronic substrate first surface such that a portion of the first microelectronic device extends over the microelectronic substrate notch to expose the at least one first microelectronic device bond pad through the microelectronic substrate notch;

electrically attaching at least one first bond wire between the at least one bond pad on the first microelectronic device and the at least one bond pad on the microelectronic substrate second surface, such that the at least one first bond wire extends through the microelectronic substrate notch;

forming a second microelectronic die having a first surface and an opposing second surface, wherein the at least one additional microelectronic die includes at least one bond pad in or on its first surface;

attaching the second microelectronic die first surface to the first microelectronic die second surface such that a portion of the second microelectronic die extends over the microelectronic substrate notch to expose the at least one second microelectronic die bond pad through the microelectronic substrate notch;

forming a third microelectronic die having a first surface with at least one bond pad in or on its first surface;

attaching the third microelectronic die first surface to the second microelectronic die second surface such that a portion of the third microelectronic die extends over the microelectronic substrate notch to expose the at least one third microelectronic die bond pad through the microelectronic substrate notch;

attaching at least one second bond wire to the at least one second microelectronic die bond pad and to at least one of the microelectronic substrate bond pads and/or to at least one first microelectronic die bond pad; and attaching at least one third bond wire to the at least one third microelectronic die bond pad and to at least one of the microelectronic substrate bond pads, to at least one first microelectronic die bond pad, and/or to at least one second microelectronic die bond pad.

11. An electronic system, comprising:
a board; and
a microelectronic structure attached to the board, wherein the microelectronic structure includes:
  a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface;
  a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch; and
  at least one first bond wire extending through the microelectronic substrate notch and electrically attached to the at least one bond pad on the first microelectronic die and to the at least one bond pad on the microelectronic substrate second surface;
  at least one additional microelectronic die having a first surface with at least one bond pad in or on the first surface, and wherein the at least one additional microelectronic die first surface is attached to the first microelectronic die second surface such that a portion of the at least one additional microelectronic die extends over the microelectronic substrate notch to expose the at least one additional microelectronic die bond pad through the microelectronic substrate notch; and
  wherein the at least one additional microelectronic die pond pad is electrically connected to corresponding microelectronic substrate bond pad with at least one additional bond wire extending through the microelectronic notch and/or with a corresponding first microelectronic die bond pad with at least one additional bond wire.

12. The electronic system of claim 11, further comprising at least one operational microelectronic device attached to the microelectronic substrate.

13. The electronic system of claim 12, wherein the at least one operation microelectronic device is in electrical communication with at least one of the first microelectronic die and the at least one additional microelectronic die.

14. An electronic system, comprising:
a board; and
a microelectronic structure attached to the board, wherein the microelectronic structure includes:
  a microelectronic substrate having a first surface, an opposing second surface, and at least one side extending between the first surface and the second surface, wherein the microelectronic substrate includes at least one notch extending into the microelectronic substrate from the at least one side thereof and wherein the microelectronic substrate includes at least one bond pad in or on the microelectronic substrate second surface;
  a first microelectronic die having a first surface and an opposing second surface, wherein the first microelectronic die includes at least one bond pad in or on the first microelectronic die first surface and wherein the first microelectronic die first surface is attached to the microelectronic substrate first surface such that a portion of the first microelectronic die extends over the microelectronic substrate notch to expose the at least one first microelectronic die bond pad through the microelectronic substrate notch; and
  at least one first bond wire extending through the microelectronic substrate notch and electrically attached to the at least one bond pad on the first microelectronic die and to the at least one bond pad on the microelectronic substrate second surface;
  a second microelectronic die having a first surface and an opposing second surface, wherein the second microelectronic die first surface is attached to the first microelectronic die, wherein the at least one additional microelectronic die includes at least one bond pad in or on its first surface, and wherein the second microelectronic die first surface is attached to the first microelectronic die second surface such that a portion of the second microelectronic die extends over the microelectronic substrate notch to expose the at least one second microelectronic die bond pad through the microelectronic substrate notch;
  a third microelectronic die having a first surface with at least one bond pad in or on its first surface, wherein the third microelectronic die first surface is attached to the second microelectronic die second surface, and wherein the third microelectronic die first surface is attached to the second microelectronic die second surface such that a portion of the third microelectronic die extends over the microelectronic substrate notch to expose the at least one third microelectronic die bond pad through the microelectronic substrate notch;
  at least one second bond wire attached to the at least one second microelectronic die bond pad and attached to at least one of the microelectronic substrate bond pads and/or to at least one first microelectronic die bond pad; and at least one third bond wire attached to the at least one third microelectronic die bond pad and attached to at least one of the microelectronic substrate bond pads, to at least one first microelectronic die bond pad, and/or to at least one second microelectronic die bond pad.

\* \* \* \* \*